United States Patent [19]
Leshem

[11] Patent Number: 5,839,906
[45] Date of Patent: Nov. 24, 1998

[54] DATA STORAGE SYSTEM

[75] Inventor: Eli Leshem, Brookline, Mass.

[73] Assignee: EMC Corporation, Hopkinton, Mass.

[21] Appl. No.: 535,450

[22] Filed: Sep. 28, 1995

[51] Int. Cl.[6] .................................................. H01R 9/09
[52] U.S. Cl. .............................................. 439/61; 439/62
[58] Field of Search ................................. 439/59, 61, 62

[56] References Cited

U.S. PATENT DOCUMENTS

| | | | |
|---|---|---|---|
| 3,316,455 | 4/1967 | Hucke, III | 439/61 |
| 3,587,029 | 6/1971 | Knowles | 439/62 |
| 4,241,381 | 12/1980 | Cobaugh et al. | 439/61 |
| 4,697,858 | 10/1987 | Balakrishnan | 439/61 |
| 4,755,145 | 7/1988 | Johnson et al. | 439/61 |
| 5,136,468 | 8/1992 | Wong et al. | 439/59 |
| 5,206,939 | 4/1993 | Yanai et al. | 395/400 |
| 5,525,063 | 6/1996 | McMichen et al. | 439/61 |

FOREIGN PATENT DOCUMENTS 1554841  12/1967  France ..................... 439/59

*Primary Examiner*—J. J. Swann
*Attorney, Agent, or Firm*—Fish & Richardson P.C.

[57] ABSTRACT

A computer/disk storage system interface is provided having disk controller, CPU controller, and cache memory printed circuit boards interconnected through buses provided in a backplane. The backplane has columns of electrical connectors. Each electrical connector has a plurality of rows of pins. One portion of the pins in each row is electrically connected to one bus and the other portion of the pins is electrically connected to the other bus. Each printed circuit board has an electrical connector adapted to connect with the backplane electrical connectors. While the number of pins in the each row of the cache memory printed circuit board electrical connector is the same as the number of pins in each row of the backplane electrical connector, the number of pins in each row of the controller printed circuit board electrical connector is less than the number of pins in the row of pins in the backplane electrical connector.

5 Claims, 5 Drawing Sheets

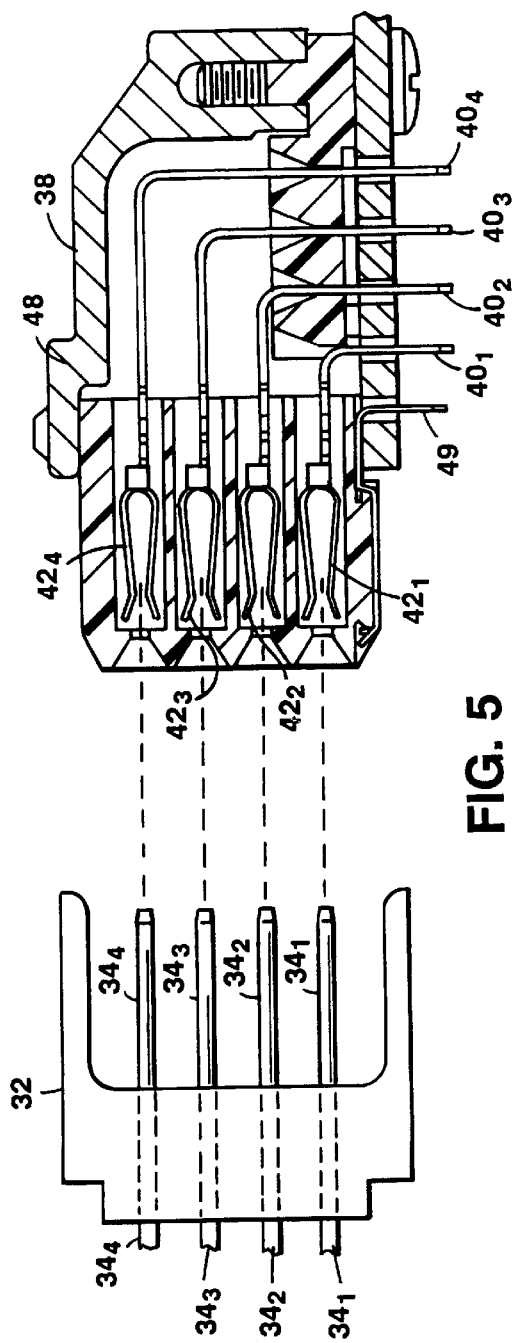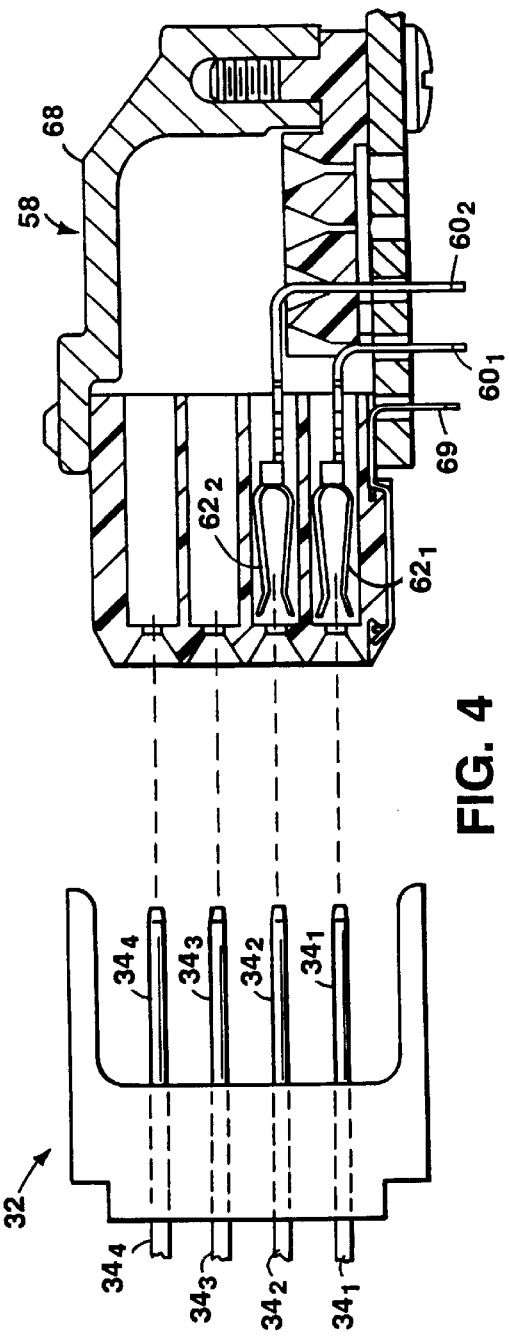

DATA STORAGE SYSTEM

BACKGROUND OF THE INVENTION

This invention relates generally to data storage systems, and more particularly to data storage systems which interact with a main frame computer through an interface.

As is known in the art, large mainframe computer systems require large capacity data storage systems. These large main frame computer systems generally includes data processors which perform many operations on data introduced to the computer system through peripherals including the data storage system. The results of these operations are output to peripherals, including the storage systems.

One type of data storage system is a magnetic disk storage system. Here a bank of disk drives and the main frame computer system are coupled together through an interface. The interface includes CPU, or "front end", controllers and "back end" disk controllers. The interface operates the controllers in such a way that they are transparent to the computer. That is, data is stored in, and retrieved from, the bank of disk drives in such a way that the mainframe computer system merely thinks it is operating with one mainframe memory. One such system is described in U.S. Pat. No. 5,206,939, entitled "System and Method for Disk Mapping and Data Retrieval", inventors Moshe Yansi, Natan Vishlitzky, Bruno Altersu and Daniel Castel, issued Apr. 27, 1993, and assigned to the same assignee as the present invention.

As described in such U.S. Patent, the interface may also include, in addition to the CPU controllers and disk controllers, a cache memory. The cache memory is a semiconductor memory and is provided to rapidly store data from the main frame computer system before storage in the disk drives, and, on the other hand, store data from the disk drives prior to being in sent to the main frame computer. Thus, cache memory being a semiconductor memory, as distinguished from a magnetic memory as in the case of the disk drives, is much faster than the disk drives in reading and writing data.

The CPU controllers, disk controllers and cache memory are interconnected through a backplane printed circuit board, hereinafter referred to as a backplane. More particularly, disk controllers are mounted on disk controller printed circuit boards. CPU controllers are mounted on CPU controller printed circuit boards. And, cache memories are mounted on cache memory printed circuit boards. The disk controller, CPU controller and cache memory printed circuit boards plug into the backplane. In order to provide data integrity in case of a failure in a controller, the backplane has a pair of buses. One set the disk controllers is connected to one bus and another set of the disk controllers is connected to the other bus. Likewise, one set the CPU controllers is connected to one bus and another set of the CPU controllers is connected to the other bus. The cache memories are connected to both buses.

In one system, the communication to the controllers and the cache memories is through a pair of bi-directional buses. One bi-directional buses is for data and the other is for control. As noted above, each controller is connected to only one of the buses and, therefore, each controller is electrically connected to one pair of bi-directional buses. However, because each one of the cache memories is connected to both buses, each cache memory is electrically connected to two pairs of bi-directional buses.

More particularly, the backplane is provided with columns of connectors. The connector in each column has four pins in each row. One pair of the pins is connected to one bus and the other pair is connected to the other bus. Further, in such system, each cache memory printed circuit board has a connector to mate with any one of the backplane connectors. Thus, each cache memory board connector has four pins in each row. One pair of the four pins, when connected to its mated backplane connector, becomes electrically connected to one bus and the other pair of four pins becomes connected to the other bus. Likewise, in such system, each controller printed circuit board has a connector to mate with any one of the columns of backplane connectors. In such system, the controller board connectors, like the cache memory connectors, are identical and therefore connectors for both the controller printed circuit boards and the cache memory printed circuit boards have four pins in each row to connect with the four pins in each row of the backplane connector.

SUMMARY OF THE INVENTION

In accordance with one feature of the present invention, a computer/disk storage system interface is provided having disk controller, CPU controller, and cache memory printed circuit boards connected to a bank of disk drives and main frame computer system though buses provided in a backplane. The backplane has columns of electrical connectors. Each connector has four pins in each row of the connector. One pair of the pins is electrically connected to one bus and the other pair of pins is connected to the other bus. Each cache memory printed circuit board has a connector to mate with the any one of the backplane connectors. The cache memory board connector has four pins in each row of the connector. One pair, when connected to its mated backplane connector, becomes electrically connected to one bus and the other pair of pins becomes connected to the other bus. Each controller printed circuit board has a connector to mate with any one of the columns of backplane connectors. Each controller printed circuit board connector has only two pins in each row of the connector to mate with only two of the four pins in each row of the backplane connector. Thus, each one of the controller printed circuit board electrical connectors has fewer pins in each row thereof than the number of pins in the row of backplane connector electrical connectors mating with it.

With such an arrangement, because the controller printed circuit boards do not have pins to connect with two of the four pins in each row of a backplane connector, driver circuitry used in the controllers and cache memories to couple signals onto the buses have substantially reduced loading as compared with an arrangement where the controller printed circuit board has additional pair of, albeit unused pins. These unused, but connected pins of the controller printed circuit boards, have been found to provide capacitive and/or electromagnetic coupling to the buses and more importantly, to driver circuitry used in the controllers and cache memories to couple data onto the buses. This capacitive coupling results in driver impedance mismatching thereby increasing the load, and hence the power used by the drivers while also reducing the response time of the system. These effects are significant in system operating with data rates in the order of 40 nanoseconds requiring pulses having rise times in the order of 1 to 2 nanoseconds.

BRIEF DESCRIPTION OF THE DRAWINGS

Referring now to the accompanying drawings:

FIG. 4 is an exploded, cross sectional elevation view of an electrical connector used for the disk and CPU controller printed circuit boards of FIG. 2 and an electrical connector for the backplane printed circuit board of FIG. 2, such connectors being adapted for mechanical and electrical interconnection;

FIG. 5 is an exploded, cross sectional elevation view of an electrical connector used for the cache memory printed circuit boards of FIG. 2 and an electrical connector for the backplane printed circuit board of FIG. 2, such electrical connectors being adapted for mechanical and electrical interconnection;

DESCRIPTION OF THE PREFERRED EMBODIMENTS

Figure 1:
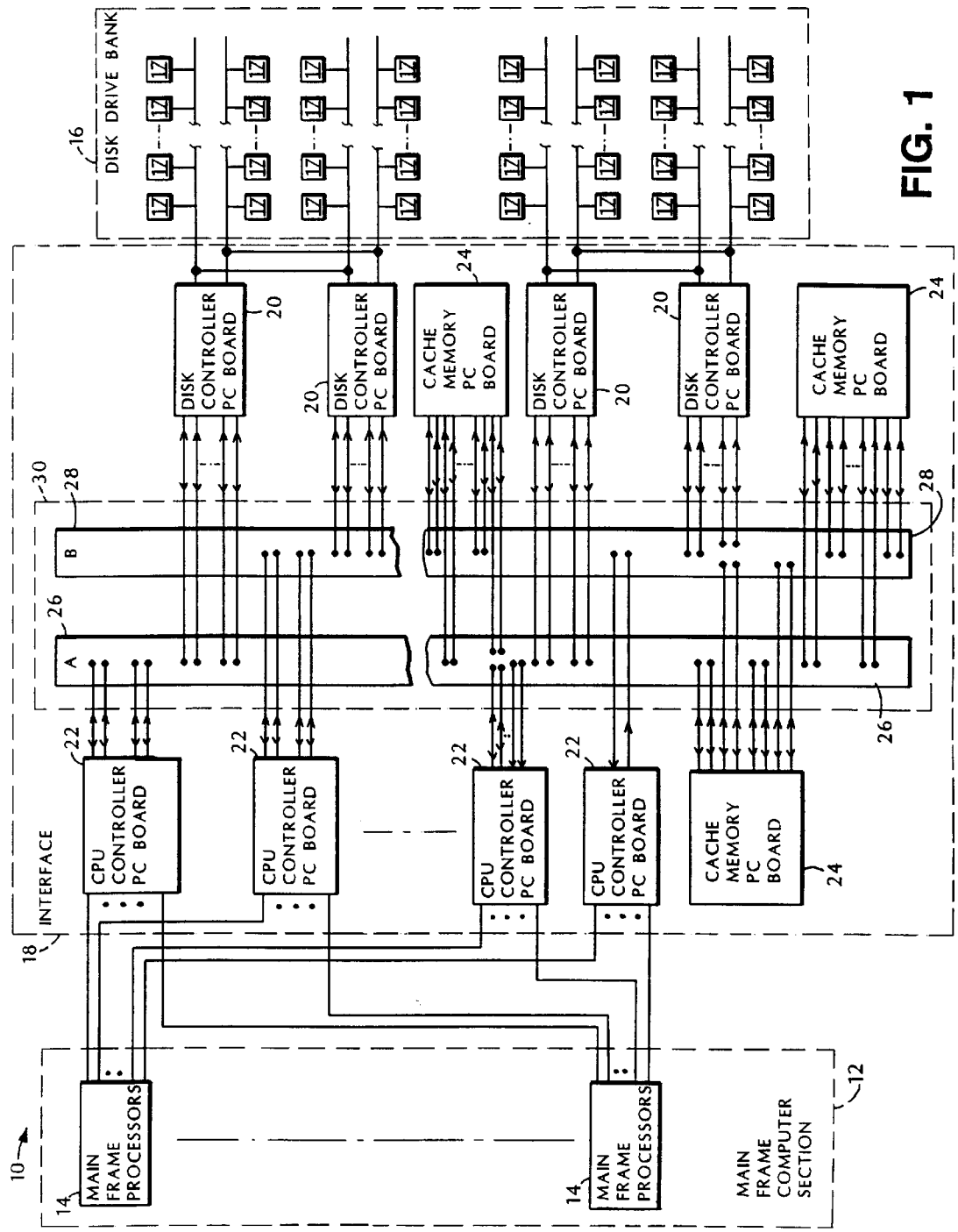
FIG. 1 is a block diagram of a computer system having an interface for providing coupling between main frame computer processors and a bank of disk storage devices according to the invention.

Referring now to FIG. 1, a computer system 10 is shown. The computer system 10 includes a main frame computer section 12 having main frame processors 14 for processing data. Portions of the processed data are stored in, and retrieved data from, a bank 16 of disk drives 17 through an interface 18.

Figure 2:
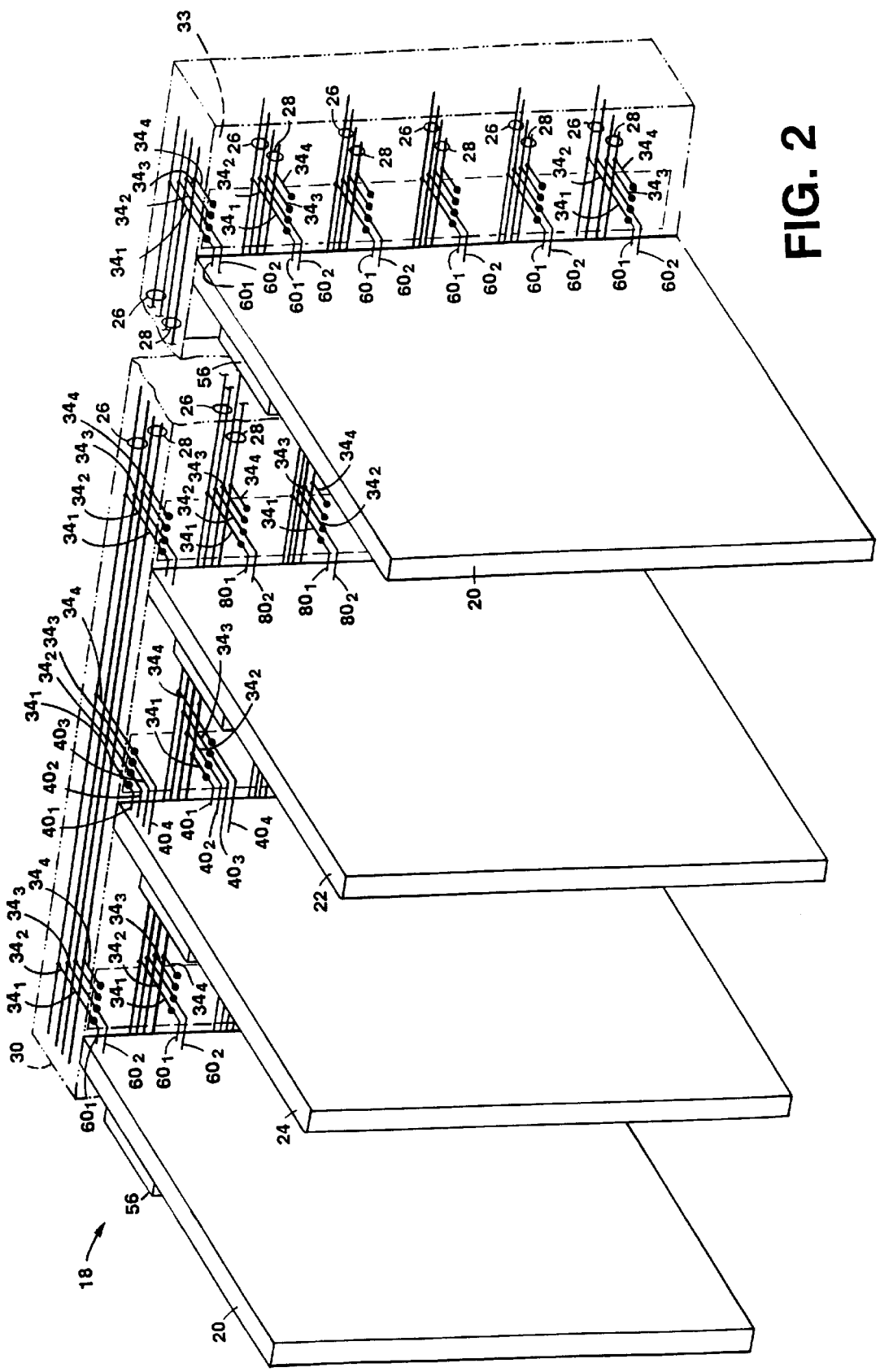
FIG. 2 is a diagrammatical, isometric sketch of an interface used in the computer system of FIG. 1, such sketch showing connections between pins of a backplane printed circuit board electrical connectors and pins of disk controller, CPU controller and cache memory printed circuit boards electrical connectors mated therewith.
Figure 3:
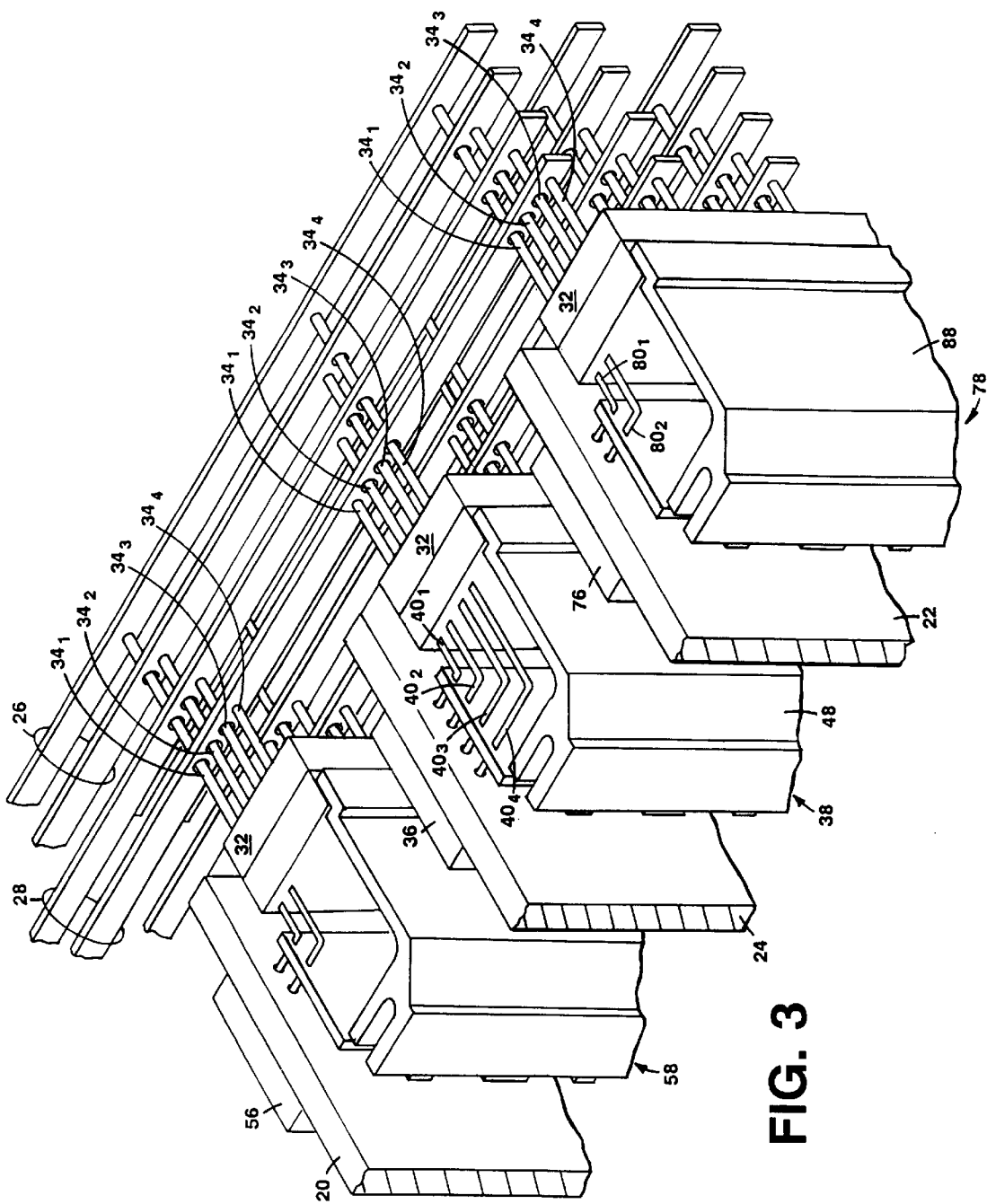
FIG. 3 is an isometric, partially broken away drawing of electrical connectors used in the disk controller, CPU controller and cache memory printed circuit boards and positioned electrically and mechanically connected with pins of the backplane printed circuit board of FIG. 2.
Figure 7:
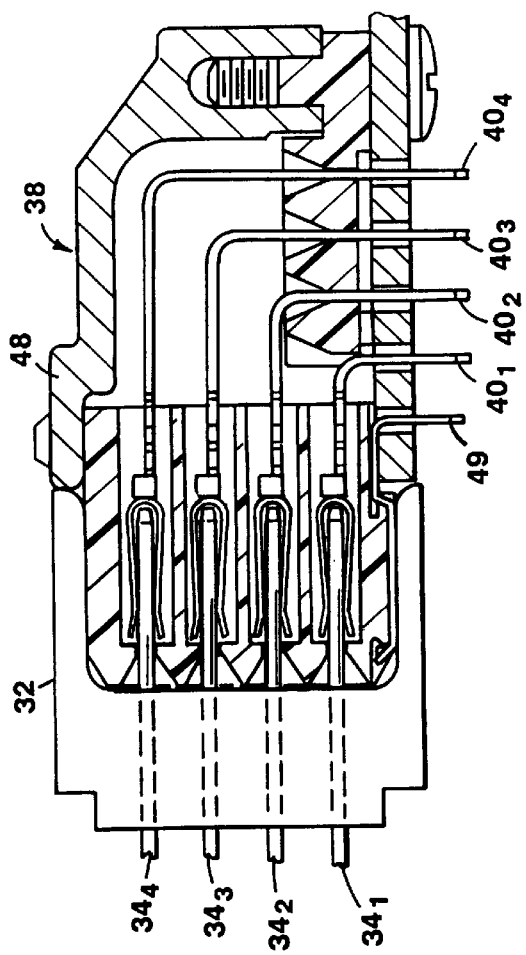
FIG. 7 is a cross sectional elevation view of an electrical connector used for the cache memory printed circuit boards of FIG. 2.
Figure 6:
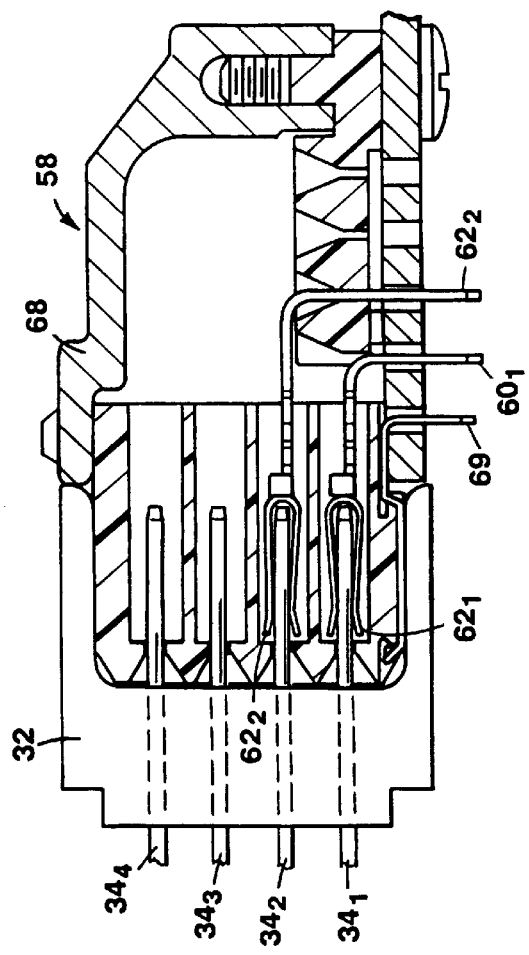
FIG. 6 is a cross sectional elevation view of an electrical connector used for the disk and CPU controller printed circuit boards of FIG. 2.

The interface 18 includes disk controller printed circuit boards 20, central processor unit (CPU) controller printed circuit boards 22 and cache memory printed circuit boards 24 electrically interconnected through a pair buses 26, 28 provided in a backplane printed circuit board 30, as shown and discussed more fully hereinafter in connection with FIG. 2. Suffice it to say here, however, that bus 26 and bus 28 are disposed in rows, as shown in FIG. 2 in different levels of the backplane printed circuit board 30, as shown. The backplane 30 is of a conventional design, here a High Density Plus model Modular Daughterboard-to-Backplane Interconnection System manufactured by Teradyne Inc,. Nashua, N.H. Thus, as shown in FIG. 3, backplane 30 has columns of male electrical connectors 32 (FIGS. 4 through 7) successively mounted along a surface 33 of the backplane 30, as shown. Each of a plurality of row has four electrically conductive pins $34_1$, $34_2$, $34_3$, $34_4$, as shown in FIGS. 3 through 7. Two of the four pins $34_1$, $34_2$, $34_3$, $34_4$ are connected to one of the buses 26, 28 and the other two of the four pins $34_1$, $34_2$, $34_3$, $34_4$ are connected to the other bus, in a conventional manner, as shown in FIG. 3.

Referring to FIGS. 2 and 3, each cache memory printed circuit board 24 has a plurality of cache memories 36 mounted thereon and an electrical connector 38 disposed in a column along an outer edge thereof. The cache memory printed circuit board electrical connector 38 (FIGS. 5 and 7) has four electrically conductive pins $40_1$, $40_2$, $40_3$, $40_4$ in each row of the cache memory printed circuit board electrical connector 38. One pair of the pins $40_1$, $40_2$, $40_3$, $40_4$ is electrically connected to one of the buses 26, 28 and the other pair of pins $40_1$, $40_2$, $40_3$, $40_4$ is connected to another one of the buses 26, 28. As shown in FIG. 5 for an exemplary one of the plurality of rows, pins $40_1$, $40_2$, $40_3$, $40_4$ terminate in female pins $42_1$, $42_2$, $42_3$, $42_4$, respectively, as indicated. Portions of pins $40_1$–$40_4$ are disposed within the shielding member 48 (FIG. 5). A ground pin 49 is also provided. While only one ground pin 49 is shown, a second ground pin, not shown, may be used. Thus, while here connector 38 is a "Stiffener For 4-Row, 4-Row+1" made by Teradyne, Inc is shown in FIG. 5, a "Stiffener For 4-Row+2" made by Teradyne, Inc may be preferable.

As shown in FIG. 2. each disk controller printed circuit board has mounted disk driver controllers 56. An electrical connector 58, shown in FIGS. 3 and 4, is disposed in a column along an outer edge of the disk controller printed circuit board 20, as shown in FIG. 3. Referring again to FIG. 2, the disk controller printed circuit board electrical connector 58 has only two electrically conductive pins $60_1$, $60_2$ in each of a plurality of rows of the connector 58. An exemplary one of the disk controller printed circuit board 22 electrical connectors 58 shown in FIGS. 4 and 6. As shown for an exemplary one of the plurality of rows, pins $60_1$, $60_2$ terminate in female pins $62_1$, $62_1$, respectively, as shown. The disk controller printed circuit board electrical connector 58 include a ground pin 69, as shown. While here only one ground pin 69 is shown, a second ground pin, not shown, may also be provided. The disk controller printed circuit board electrical connector 58 has an electrically conductive, shielding member 68, as shown more clearly in FIG. 4. Portions of the pins $60_1$, $60_2$ are disposed within the shielding member 68, as shown in FIG. 4 for an exemplary one of the rows of the pins $60_1$, $60_2$.

Likewise, central processor unit (CPU) controller printed circuit boards 22 (FIG. 1) have CPU controllers 76 mounted thereon as shown in FIG. 3. Each CPU controller printed circuit board 22 has an electrical connector 78 (FIG. 3) disposed in a column along an outer edge thereof (FIG. 2). The CPU controller 76 printed circuit board electrical connector 78 is of the same configuration as the disk controller printed circuit board electrical connector 58 (FIG. 4) used for the disk controller printed circuit boards 20. Thus, the CPU printed circuit board 22 electrical connector 78 has only a pair of electrically conductive pins $80_1$, $80_2$ in each of a plurality of rows of the CPU printed circuit board electrical connector 78. Each pair of conductive pins $80_1$, $80_2$ is electrically connected to one of the CPU controllers 76 mounted to the CPU controller printed circuit board 22. The other ends of pins $80_1$, $80_2$ terminate in female pins in the same manner as pins $60_1$, $60_2$ terminate in female pins $62_1$, $62_2$, respectively, as shown in FIG. 4. Portions of pins $80_1$, $80_2$ are disposed within the shielding member 88 (FIG. 3) in the same manner as the electrical shield member 68 for the disk controller printed circuit board electrical connector 58 (FIG. 4) for the disk controller printed circuit board 20.

Because the disk controller and CPU controller printed circuit boards 20, 22 do not have pins to mechanically connect with one of the two pairs of pins $34_1$, $34_2$, $34_3$, $34_4$, here pins $34_3$, $34_4$, in each of the plurality of rows of a backplane connector 32, driver circuitry used in the controllers 56, 76 and cache memories 36 to couple signals onto the buses 26, 28 have substantially reduced loading as compared with an arrangement where the controller printed circuit board 20, 22 have an additional pair of, albeit unused pins, mechanically connected to corresponding pins of the backplane connector. These unused, but mechanically connected pins of the controller printed circuit boards 20, 22, have been found to provide capacitive and/or electromagnetic coupling to the buses and more importantly, to driver circuitry used in the controllers 56, 76 and cache memories 36 to couple data onto the buses 26, 28. This capacitive coupling results in driver impedance mismatching thereby increasing the load, and hence the power used by the drivers while also reducing the response time of the system. These effects are significant in system operating with data rates in the order of 40 nanoseconds requiring pulses having rise times in the order of 1 to 2 nanoseconds.

Other embodiments are within the spirit and scope of the appended claims.

What is claimed is:

1. A computer/disk storage system interface, comprising:

disk controller, CPU controller, and cache memory printed circuit boards;

a backplane having a pair of buses for interconnecting the disk controller, CPU controller and cache memory printed circuit boards, the backplane having columns of electrical connectors, each electrical connector having a plurality of rows of pins, one portion of the pins in each row being electrically connected to one bus and the other portion of the pins being electrically connected to the other bus; and wherein each printed circuit board has an electrical connector adapted to connect with the backplane electrical connectors, the number of pins in each row of the cache memory printed circuit board electrical connector being the same as the number of pins in each row of the backplane electrical connector and the number of pins in each row of the controller printed circuit board electrical connector being less than the number of pins in the row of pins in the backplane electrical connector.

2. A computer/disk storage system interface, comprising:

controller printed circuit boards having electrical connectors, each of the electrical connectors having a plurality of rows of pins electrically connected to controllers mounted on the board, each row having a plurality of pins;

cache memory printed circuit boards having electrical connectors, each of the electrical connectors having a plurality of rows of pins electrically connected to cache memories mounted on the cache memory printed circuit board, each row of pins having a plurality of pins, the number of pins in each row of the cache memory printed circuit board electrical connector being greater than the number of pins in each row of the controller printed circuit board connector;

a backplane having a pair of buses and columns of electrical connectors, each electrical connector thereof having a plurality of rows of pins, each row having a plurality of pins greater than the number of pins in each row of the controller printed circuit board connector, one portion of the pins in each row of the backplane electrical connector being electrically connected to one of the buses and the other portion of the pins in each row of the backplane electrical connector being electrically connected to the other bus;

the controller printed circuit boards being disposed in columns with the pins in each row of the electrical connector thereof being electrically connected to only a portion of the pins in each row of the backplane electrically connector; and the cache memory printed circuit boards being disposed in other columns with the pins in each row of the electrical connector thereof being electrically connected to both portions of the pins in each row of the backplane electrical connector.

3. A computer/disk storage system interface, comprising:

controller printed circuit boards having electrical connectors with a plurality of rows of pins electrically connected to controllers mounted on the boards, each row having two pins;

cache memory printed circuit boards having electrical connectors with a plurality of rows of pins electrically connected to cache memories mounted on the cache memory printed circuit boards, each row having two pairs of pins;

a backplane having: a pair of buses; and columns of electrical connectors, each electrical connector thereof having rows of pins, each row having two pairs of pins, one pair being electrically connected to one of the buses and the other pair of pins being connected to the other bus;

the controller printed circuit boards being disposed in columns with the pair of the electrically conductive pins in each row thereof being electrically connected to only one of the two pairs of backplane pins; and the cache memory printed circuit boards being disposed in other columns with the two pairs of electrically conductive pins in each row thereof being electrically connected to the two pairs of backplane pins.

4. A computer/disk storage system interface, comprising:

(A) controller printed circuit boards having controllers mounted to a surface portion thereof, the controllers being electrically connected to edge mounted electrical connectors, each of the electrical connector having a pair of pins for each one of the controllers mounted thereon;

(B) cache memory printed circuit boards having cache memories mounted on surface portions thereof, the cache memories being electrically connected to edge mounted electrical connectors, each of the electrical connectors having two pair of pins for each one of the cache memories mounted thereon;

(C) a backplane having:

(i) first and second electrical buses;

(ii) columns of electrical connectors mounted on a surface of the backplane, each one of the electrical connectors having rows of backplane pins, each row having two pairs of backplane pins, one pair being electrically connected to the first bus and the other pair being connected to the second bus;

(D) wherein the controller printed circuit boards are disposed in selected ones of the columns of backplane electrical connectors with the pair of pins in each row of the electrical connector thereof being electrically connected to only one of the two pairs of backplane pins in each row of pins of the backplane electrical connector;

(E) wherein the cache memory printed circuit boards are disposed in other selected ones of the columns of backplane electrical connectors with the two pairs of electrically conductive pins in each row of the electrical connector thereof being electrically connected to the two pairs of pins in each row of the backplane electrical connector.

5. A computer system wherein central processors process data, portions of such data being stored in, and retrieved data from, a bank of disk drives through an interface, the interface comprising:

(A) disk controller printed circuit boards, each such printed circuit board having:
  (i) disk driver controllers mounted thereon;
  (ii) a disk controller electrical connector disposed on an outer edge thereof, each disk controller electrical connector having:
    (a) a plurality of rows of electrically pins, each row having a pair of the pins electrically connected to a corresponding one of the disk controllers; and,
    (b) an electrically conductive, shielding member, portions of the pins being disposed within the shielding member;
(B) CPU controller printed circuit boards, each such printed circuit board having:
  (i) CPU controllers mounted thereon;
  (ii) a CPU electrical connector disposed on an outer edge thereof, each CPU electrical connector having:
    (a) a plurality of rows of electrically pins, each row having a pair of electrically conductive pins electrically connected to a corresponding one of the central processors; and,
    (b) an electrically conductive, shielding member, portions of the pins being disposed within the shielding member;
(C) cache memory printed circuit boards, each such printed circuit board having:
  (i) cache memories mounted thereon;
  (ii) a cache memory electrical connector disposed on an outer edge thereof, each cache memory electrical connector having:
    (a) a plurality of rows of electrically pins, each row having two pair of side-by-side positioned electrically conductive pins electrically connected to a corresponding one of the cache memories; and,
    (b) an electrically conductive, shielding member, the pins being disposed within the shielding member;
(D) a backplane having:
  (i) first and second electrical buses;
  (ii) columns of backplane electrical connectors mounted on a surface of the backplane, each backplane electrical connector having:
    (a) rows of backplane pins, each row having two pairs of side-by-side positioned backplane pins;
(E) wherein the disk controller printed circuit boards are disposed in selected ones of the columns of backplane electrical connectors with each pair of electrically conductive disk controller connector pins electrically connected to only one of the two pairs of side-by-side positioned backplane pins;
(F) wherein the CPU controller printed circuit boards are disposed in selected ones of the columns of backplane electrical connectors with each pair of electrically conductive CPU connector pins electrically connected to only one of the two pairs of side-by-side positioned backplane pins;
(G) wherein the cache memory printed circuit boards are disposed in other selected ones of the columns of backplane electrical connectors with the two pairs of the electrically conductive cache memory pins being electrically connected to the two pairs of pins of the backplane connectors.

* * * * *